United States Patent [19]

Wallner et al.

[11] Patent Number: 5,017,447
[45] Date of Patent: May 21, 1991

[54] PHOTOSENSITIVE EMULSION FOR HOLOGRAPHIC PLATES AND METHOD

[75] Inventors: Jane Wallner, Northridge; Kevin Yu, Temple City, both of Calif.

[73] Assignee: Hughes Aircraft Company, Los Angeles, Calif.

[21] Appl. No.: 299,855

[22] Filed: Jan. 23, 1989

[51] Int. Cl.⁵ .................................. G03C 1/66
[52] U.S. Cl. ........................... 430/2; 430/281; 430/906; 430/270
[58] Field of Search .............. 430/2, 270, 906, 281

[56] References Cited
U.S. PATENT DOCUMENTS

| | | | |
|---|---|---|---|
| 2,500,028 | 3/1950 | Griggs et al. | 430/270 |
| 3,617,274 | 3/1968 | Lin | 430/2 X |
| 3,909,273 | 9/1975 | Levinos | 430/281 X |
| 3,963,490 | 6/1976 | Graube | 430/2 X |
| 4,012,256 | 3/1977 | Levinos | 430/281 X |

FOREIGN PATENT DOCUMENTS 1470168 4/1977 United Kingdom ............... 430/2

Primary Examiner—Cynthia Hamilton
Attorney, Agent, or Firm—Leonard A. Alkov; Wanda K. Denson-Low

[57] ABSTRACT

The optical image properties of gelatin holograms are improved by reducing uneven shrinkage during chemical development. This is accomplished by introducing from 2 to 10 weight percent of a water soluble sizing agent into the gelatin. Suitable sizing agents include polyvinylpyrrolidone homopolymer and polyvinylpyrrolidone-vinyl acetate copolymers.

7 Claims, 1 Drawing Sheet

PHOTOSENSITIVE EMULSION FOR HOLOGRAPHIC PLATES AND METHOD

BACKGROUND OF THE INVENTION

1. Field of the Invention

The present invention relates generally to holograms and the photosensitive emulsions that are present on holographic plates. More specifically, the invention relates to reducing the poor holographic image quality which results from uneven shrinkage of photosensitive gelatin during chemical development of the latent image contained in the gelatin.

2. Description of Related Art

Holograms are widely used for a variety of purposes including: helmet-mounted displays; eye protection reflectors for laser radiation; non-destructive structural testing of manufactured parts; and novelty displays. In fabricating a hologram, a holographic plate comprising a layer of photosensitive emulsion on a substrate is exposed to an electromagnetic wave interference pattern to record a latent image on the plate. The photosensitive emulsion is then developed by a series of chemical treatments to obtain the recorded latent image.

A photosensitive emulsion widely used in fabricating holograms is dichromated gelatin. A problem has been experienced with the use of dichromated gelatin as the photosensitive emulsion on holographic plates in that the chemical development of the latent image recorded in the gelatin results in uneven shrinkage of the gelatin, thereby producing a wavy surface on the holographic plate and a hologram of reduced optical image quality.

More specifically, when a holographic plate's coating of dichromated gelatin is exposed to interfering wave patterns of electromagnetic energy, the interference patterns induce energy into the gelatin. Where the interference pattern consists of constructively interfering waves, a greater amount of energy is imparted to the gelatin. Conversely, where destructively interfering patterns exist, a lesser amount of energy is imparted to the gelatin. The energy imparted to the gelatin initiates a chemical reaction which converts the ammonium dichromate to chromium ion and starts the polymerization of the gelatin. The degree of polymerization or cross-linking is proportional to the amount of energy imparted. Hence, in areas where constructively interfering wave patterns impart energy to the gelatin, the degree of cross-linking will be greater. And in areas where energy is imparted by destructively interfering wave patterns, the cross-linking will be less.

The existence of areas of varying degrees of cross-linking within the gelatin results in localized differences in the gelatin's molecular weight and refractive index: where cross-linking is greater, molecular weight and refractive index are greater; and where cross-linking is less, molecular weight and refractive index are less. When a holographic plate utilizing a dichromated gelatin photosensitive emulsion undergoes the chemical treatments required to develop a latent image recorded in the gelatin, the localized differences in molecular cross-linking and molecular weight result in uneven shrinkage of the gelatin. This in turn results in uneven lines in the interference pattern recorded in the gelatin and reduced optical image quality of the hologram.

The above-mentioned problem of uneven gel shrinkage is a particular problem in connection with slant holograms. The slant wave interference pattern in a slant hologram produces slanted layers in the gel having varying degrees of cross-linking. Variations in the shrinkage of the slanted layers during processing of the slant holograms produces wavy fringe patterns that adversely affect image quality.

In view of the above problems, there is a continuing need to provide improved photosensitive gels which can be developed according to conventional hologram processing procedures without problems of uneven shrinkage and the resulting poor image quality.

SUMMARY OF THE INVENTION

In accordance with the present invention, the undesirable effects of uneven shrinkage of photosensitive gelatin on holographic plates are reduced by the introduction into the gelatin of sizing agents that strengthen the gelatin's molecular structure without interfering with its holographic recording function.

The sizing agents which are introduced into the gelatin in accordance with the present invention includes materials such as polyvinylpyrrolidone (PVP) homopolymer or polyvinylpyrrolidone-vinyl acetate (PVP-VA) copolymer. These polymers are both nontoxic and can be commonly obtained having pharmaceutical grade purity. In addition, they are both water soluble and therefore compatible for use with the water based gelatin.

In a preferred embodiment of the present invention, either PVP or PVP-VA polymer is homogeneously combined with dichromated gelatin prior to the gelatin's application to a substrate to form a holographic plate. The added polymer then interacts with the dichromated gelatin to give a gelatin of increased structural strength. This improved dichromated gelatin is then used to coat a substrate and thereby form a holographic plate.

When the holographic plate is exposed to interfering patterns of electromagnetic waves, a latent image is recorded in the gelatin The presence of PVP or PVP-VA polymer in the dichromated gelatin does not interfere with the gelatin's holographic recording ability. When the latent image recorded in the exposed holographic plate is developed through a series of chemical treatments, the increased structural strength of the dichromated gelatin caused by the addition of PVA or PVP-VA results in a reduction in the degree of uneven shrinkage of the gelatin and an increase in the optical image quality of the hologram.

The above discussed and other features and advantages of the present invention will become apparent from a consideration of the following detailed description when taken in conjunction with the accompanying drawings.

DESCRIPTION OF THE PREFERRED EMBODIMENTS

The present invention is an improvement upon emulsions used as photosensitive coatings in holographic plates.

Although the following description will be limited to a discussion of dichromated gelatins, it will be understood that the present invention has application to any water soluble photosensitive emulsion wherein reduction in uneven shrinkage during processing is desirable. Other possible emulsions to which this invention has application include silver halide sensitized gelatin.

Figure 1:
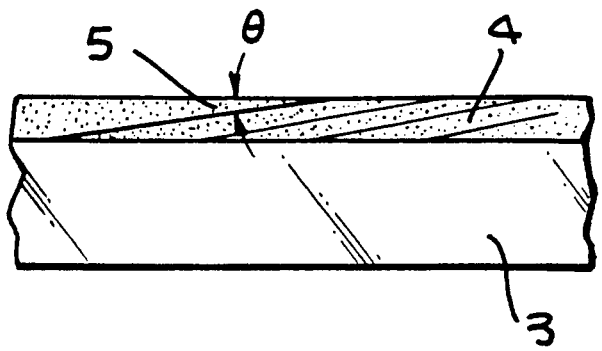
FIG. 1 is a diagrammatical cross-sectional view of a 5° slant hologram.

The invention is especially useful in improving the optical properties of slant holograms of the type shown generally at 2 in FIG. 1. The slant hologram 2 includes a glass substrate 3 and a dichromated gelatin coating 4 which has a slant angle 0 shown at 5. Holograms of this type are known and do not form part of the invention. Instead, the invention is directed to treating the slant hologram with suitable sizing agents to reduce uneven shrinkage of the hologram during development and chemical processing.

Presently, dichromated gelatin used as a photosensitive emulsion on holographic plates is subject to uneven shrinkage when it undergoes the series of chemical treatments necessary to develop a latent image recorded in the gelatin. This uneven shrinkage results in an uneven surface on the holographic plate and a hologram of reduced optical image quality. The uneven shrinkage of the gelatin results from localized differences in molecular weight and refractive index in the gelatin. The localized differences are in turn caused by differing degrees of polymerization or cross-linking within the dichromated gelatin resulting from exposing the gelatin to electromagnetic wave interference patterns that impart varying amounts of energy to different portions of the gelatin.

In accordance with the present invention, it was discovered that the structural strength of the dichromated gelatin coating may be increased by introducing a sizing agent into the gelatin. Sizing agents include any of the water soluble polymers which can be introduced into the gel to strengthen the gel without otherwise adversely affecting the hologram Preferred sizing agents include polyvinylpyrrolidone (PVP) or polyvinylpyrrolidone-vinyl acetate copolymer (PVP-VA). The introduction of either of these two polymers does not interfere with the holographic recording function of the dichromated gelatin. In order to be water soluble, the polymer should have a molecular weight of below 150,000 daltons.

The amount of vinyl acetate present in the PVP-VA copolymers may range from 30 to 80%. A preferred copolymer comprises approximately 40% vinyl acetate.

PVP may also be copolymerized with other suitable monomers including N-methylpyrrolidone. However, vinyl acetate is preferred.

In accordance with the present invention, in a dichromated gelatin there should be dispersed from 2 to 10 weight percent of PVP or PVP-VA sizing agent The preferred range of sizing agent is from 4 to 6 weight percent, and 5 weight percent has been observed to provide the best results for some applications. The amount of ammonium dichromate present in the dichromated gelatin varies depending on the intended use of the holographic plate to be coated by the photosensitive agent. For most applications from 10 to 20 weight percent is sufficient and 15 weight percent is preferred.

In a preferred embodiment of the present invention a dichromated gelatin is prepared by first preparing a gelatin solution comprising about a 6 to 10 weight percent concentration of approximately 270 to 275 bloom strength gelatin in water, and then homogeneously combining the solution with an amount of ammonium dichromate equal to about 12 to 18 weight percent of the gelatin. The bloom strength or bloom rating of a gelatin is a term well known in the art and is a measure of the firmness of a gel. The rating represents the number of grams of lead shot required to depress a 12.6 millimeter diameter plunger 4 millimeters into the surface of a 6.67% gelatin that has been maintained in a chill bath at 10° C. for 17 hours.

The resulting aqueous mixture of dichromate and gelatin is then homogeneously combined with an amount of PVP or PVP-VA equal to about 4 to 6 weight percent of the pre-dichromated gelatin. The combined PVP-dichromate-gelatin mixture is then used to coat a substrate and thereby create a holographic plate.

Upon exposure to an appropriate electromagnetic wave interference pattern, a latent image is recorded in the photosensitive dichromated gelatin. This latent image is developed by a series of conventional chemical treatments including: swelling the dichromated gelatin and removal of any unreacted ammonium dichromate salt through immersion and slight agitation of the exposed plate in about a 12 to 18 solution of triethanol amine for about 4 to 6 minutes; removal of water from the dichromated gelatin by repeated immersion and agitation of the exposed plate in baths of increasing percentages of isopropanol; raising the latent image in the gelatin by immersing the exposed plate in about a 70°–75° C. 100% isopropanol bath for about 2 minutes; drying the holographic plate with a hot air source such as a hot air gun; and baking the holographic plate in an approximately 75° to 85° C. oven for about 13 to 17 minutes. The resulting developed holographic plate exhibits a significantly smoother surface and more even gelatin shrinkage than similarly developed holographic plates that do not have PVP added to dichromated gelatin. The smoother surface and more even gelatin shrinkage results in a hologram of improved optical image quality.

Examples of practice are as follows:

EXAMPLE 1

A holographic plate was prepared as follows. A glass plate, approximately 4"×4"×¼", was cleaned using conventional cleaning procedures and a 10 mil thickness of adhesion tape was applied to the corner of the glass plate as a spacer. A glass mold, approximately 13"×13"×¼", was cleaned using conventional cleaning procedures, and the mold release Frekote 44 was applied to the surface of the glass. Then the glass mold and the glass plate were placed in an environmental chamber at 50° C. for 30 minutes.

Next, an 8% concentration of 270–275 bloom strength gelatin was prepared in a 50° C. water bath and mixed until homogeneous To this was added an amount of ammonium dichromate equal to 15 weight percent of the gelatin and mixed until homogeneous. This dichromated gelatin was then homogeneously combined with an amount of PVP equal to 5 weight percent of the pre-dichromated gelatin.

Next, within the environmental chamber and with only red lighting present, the gelatin solution was poured onto the glass mold and the glass plate was placed onto the mold surface. The mold and plate were then placed together into a refrigerator at 4° C. for 2 hours. Finally, the glass plate was removed from the mold and air dried on a laminar flow bench for 20 hours. Thereafter, the plate was stored until ready for exposure.

Figure 5:
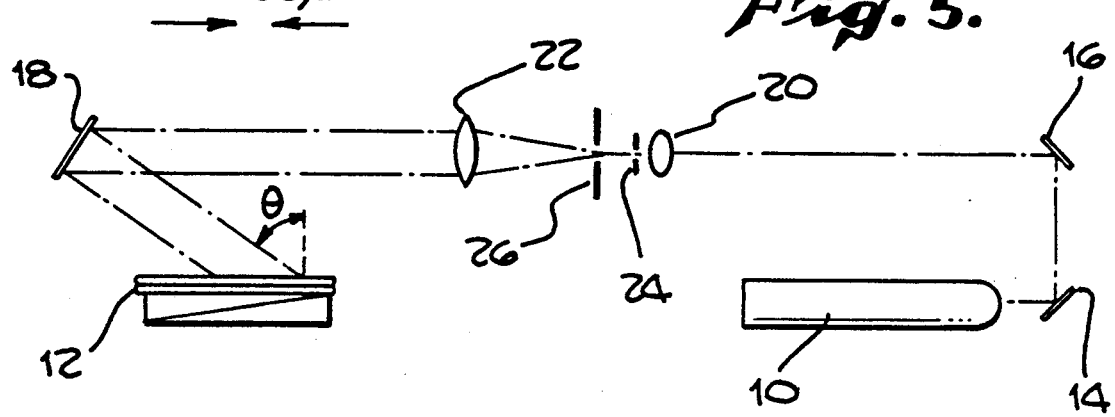
FIG. 5 is a diagrammatic representation of the exposure system used to produce the slant holograms depicted in FIGS. 2-4.

Exposure of the holographic plate was accomplished in accordance with the exposure system diagrammed in FIG. 5. The exposure system includes an Argon laser 10 which is directed to the gelatin plate 12 by an optical system which included mirrors 14, 16, 18 and lenses 20 and 22. Lens 20 is an objective lens and lens 22 is an acromat lens. The optical system also included pin hole 24 and iris 26. All of these components are conventionally used in exposure of slant holograms. The exposure procedure was as follows. The Argon laser 10 was turned on and set at a level of 20 amps. The optical system was then aligned.

Next, with the laser shutter closed, the current was increased to 30 amps, the laser's power output was set at about 2 watts, and the laser system was allowed to stabilize for 3 hours until its power output was uniform. The output was checked by a power meter at the exposure location.

The PVP-dichromated gelatin holographic plate was then placed on a 5° wedge with index match mineral oil between it and the wedge. Next, an anti-reflection coated plate was placed on top of the holographic plate, also with index match mineral oil between them. The wedge and plates were allowed to stabilize for 10 minutes and then the holographic plate was exposed to the laser's output for approximately 10-20 seconds.

After exposure was completed, the holographic plate was rinsed with hexane solution to remove the mineral oil. Thereafter it was ready for development.

EXAMPLE 2

A holographic plate was prepared and exposed as described in Example 1, except that instead of homogeneously combining the dichromated gelatin with PVP, it was homogeneously combined with an amount of PVP-VA equal to 5 weight percent of the pre-dichromated gelatin.

EXAMPLE 3

In addition, a convention holographic plate was prepared and exposed as described in Example 1 and neither PVP nor PVP-VA was added to the dichromated gelatin.

All of the above described examples of holographic plates were developed using conventional procedures including the following steps: immersing the exposed plates, without agitation, into an 18% solution of Kodak fixer for 2 minutes; removing the plates from the fixer, rinsing them quickly with deionized water, and immersing them for 5 minutes in a 15% solution of triethanol amine [TEA] while slightly agitating the plates; removing the plates from the TEA solution and placing them for 1 minute in a 50% bath of isopropanol [IPA] with agitation; repeating the last step with consecutive baths of 75% and 100% IPA; placing the plates in a 70-75° C. 100% IPA bath for about 1-2 minutes or until the latent holographic image appears; removing the plates from the last bath and immediately drying them with a hot air gun for about 3 minutes; baking the plates in an 80° C. oven for about 15 minutes; after cooling, sealing the baked plates with optical adhesive; and curing the adhesive with ultraviolet light for 30 minutes.

Figure 2:
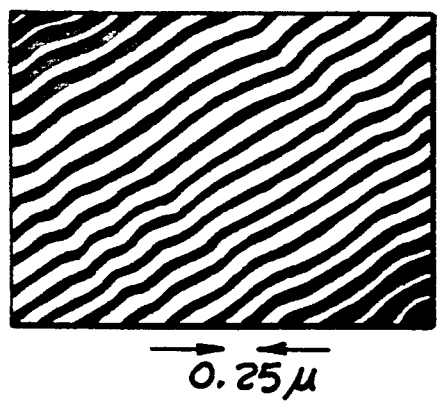
FIG. 2 is an optical micrograph of a 5° slant hologram made with a conventional dichromated gelatin.

The improved optical image quality of the holographic plates utilizing PVP or PVP-VA is seen in several ways. First, FIGS. 2-4, which depict optical micrographic analyses of the surfaces of the three holographic plate examples described above, shows how the interference fringes of the plates having PVP (FIG. 3) and PVP-VA (FIG. 4) are significantly straighter than the fringes on the conventional plate (FIG. 2). As described hereinabove, such straighter fringes results&s in improved holographic plate optical image quality.

Figure 3:
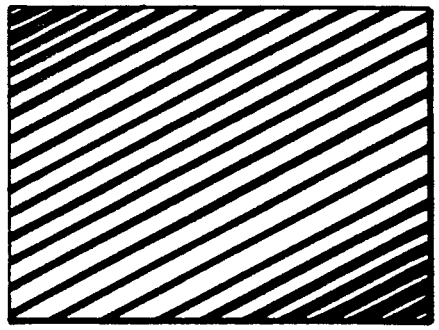
FIG. 3 is an optical micrograph of a 5° slant hologram in accordance with the present invention wherein PVP polymer has been added to the gelatin.
Figure 4:
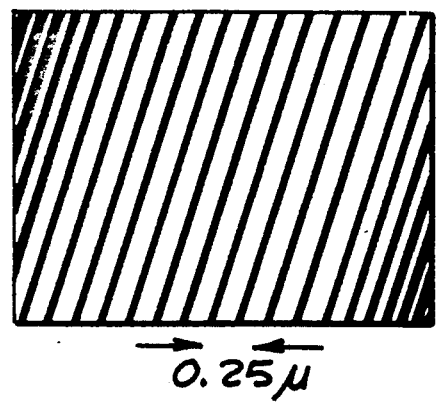
FIG. 4 is an optical micrograph of a 5° slant hologram in accordance with the present invention wherein PVP-VA copolymer has been added to the gelatin.

In addition to the visible improvement in interference fringes shown in FIGS. 3 and 4, the holograms described in the examples were also examined for optical image quality by two different methods. The first method involved comparing a human observer's ability to resolve test patterns from various reflection images. This test is particularly significant since it approximates the actual conditions of use when holograms are employed in helmet-mounted displays. The image resolution was found to be markedly better for the holograms of examples 1 and 2 which were made in accordance with the present invention.

The second method of evaluation involved the use of spatial scanning by a photometer. This evaluation also demonstrated that the holograms of examples 1 and 2 provided better modulation than was possible with the hologram of example 3 which did not include a sizing agent in accordance with the present invention.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but are only limited by the following claims.

What is claimed is:

1. A gel suitable for use as a photosensitive emulsion in a hologram wherein said gel is exposed to radiation and a recorded image is formed, said gel consisting essentially of gelatin having dispersed therein from 2 to 10 weight percent of a sizing agent and a sufficient amount of a photosensitive agent to provide a recordable image when said gel is exposed to radiation, wherein said photosensitive agent is ammonium dichromate, and wherein said sizing agent comprises a polyvinly-pyrrolidone-polyvinly acetate copolymer.

2. An improved photosensitive gel as defined in claim 2, wherein said gel is made from an aqueous emulsion which comprises between about 6% to 10% weight percent of 270 to 275 bloom strength gelatin homogeneously mixed with between about 12 to 18 weight percent of ammonium dichromate, based on 100 percent by weight of said concentration of gelatin.

3. An improved photosensitive gel as defined in claim 1 wherein said gel comprises between about 4 to 6 by weight percent of polyvinylpyrrolidone-polyvinyl acetate copolymer based on 100 percent by weight of said gelatin.

4. An improved holographic plate comprising:
a substrate;
a photosensitive emulsion coating on at least a portion of said substrate wherein said photosensitive emulsion includes a dichromated gelatin homogeneously combined with from 2 to 10 weight percent of a sizing agent wherein said sizing agent strengthens the structure of said dichromated gelatin to thereby reduce uneven shrinkage during chemical development of said photosesitive emulsion and improve the image quality of said holographic plate, wherein said sizing agent comprises a polyvinyl-pyrrolidone homopolymer.

5. An improved holographic plate comprising:

a substrate;

a photosensitive emulsion coating on at least a portion of said substrate wherein said photosensitive emulsion includes dichromated gelatin homogeneously combined with from 2 to 10 weight percent of a sizing agent wherein said sizing agent strengthens the structure of said dichromated gelatin to thereby reduce uneven shrinkage during chemical development of said photosensitive emulsion and improve the image quality of said holographic plate, wherein said sizing agent comprises a polyvinyl-pyrrolidone-polyvinyl acetate copolymer.

6. An improved holographic plate comprising:

a substrate;

a photosensitive emulsion coating on at least a portion of said substrate wherein said photosensitive emulsion includes a dichromated gelatin homogeneously combined with from 2 to 10 weight percent of a sizing agent wherein said sizing agent strengthens the structure of said dichromated gelatin to thereby reduce uneven shrinkage during chemical development of said photosensitive emulsion and improve the image quality of said holographic plate, wherein said dichromated gelatin is made from an aqueous emulsion which comprises about 6 to 10 weight percent of 270 to 275 bloom strength gelatin homogeneously mixed with between about 12 to 18 weight percent of ammonium dichromate based on 100 percent by weight of said concentration of gelatin, and said dichromated gelatin comprises between about 4 to 6 percent weight of polyvinyl-pyrrolidone-homopolymer based on 100 percent by weight of said gelatin.

7. An improved holographic plate comprising:

a substrate;

a photosensitive emulsion coating on at least a portion of said substrate wherein said photosensitive emulsion includes a dichromated gelatin homogeneously combined with from 2 to 10 weight percent of a sizing agent wherein said sizing agent strengthens the structure of said dichromated gelatin to thereby reduce uneven shrinkage during chemical development of said photosensitive emulsion and improve the image quality of said holographic plate, wherein said dichromated gelatin is made from an aqueous emulsion which comprises about 6 to 10 weight percent of 270 to 275 bloom strength gelatin homogeneously mixed with between about 12 to 18 weight percent of ammonium dichromate based on 100 percent by weight of said concentration of gelatin, and said dichromated gelatin comprises between about 4 to 6 percent by weight of polyvinyl-pyrrolidone-polyvinyl acetate copolymer based on 100 percent by weight of said gelatin.

* * * * *